(12) United States Patent
Moon et al.

(10) Patent No.: US 8,692,223 B2
(45) Date of Patent: Apr. 8, 2014

(54) RESISTANCE VARIABLE MEMORY DEVICE INCLUDING NANO PARTICLES AND METHOD FOR FABRICATING THE SAME

(75) Inventors: Ji-Won Moon, Gyeonggi-do (KR); Moon-Sig Joo, Gyeonggi-do (KR); Sung-Hoon Lee, Gyeonggi-do (KR); Jung-Nam Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/596,807

(22) Filed: Aug. 28, 2012

(65) Prior Publication Data
US 2013/0168632 A1 Jul. 4, 2013

(30) Foreign Application Priority Data

Dec. 29, 2011 (KR) .................. 10-2011-0146243

(51) Int. Cl.
*H01L 47/00* (2006.01)
(52) U.S. Cl.
USPC .............. 257/4; 257/E45.001; 438/382
(58) Field of Classification Search
USPC ............. 257/2–5, 9, 214, 298, 295, 310, 314, 257/E21.35, E21.209, E21.21; 438/102, 438/103, 135, 211, 237, 240, 585, 785, 438/900; 365/46, 94, 100, 129, 163
See application file for complete search history.

(56) References Cited

U.S. PATENT DOCUMENTS

| 2007/0054502 | A1* | 3/2007 | Seol et al. ...................... 438/782 |
| 2007/0090444 | A1* | 4/2007 | Park et al. ..................... 257/314 |
| 2008/0083916 | A1* | 4/2008 | Kim ................................. 257/2 |
| 2009/0027944 | A1* | 1/2009 | Ufert ............................. 365/148 |
| 2009/0147558 | A1* | 6/2009 | Tamai et al. .................. 365/148 |

FOREIGN PATENT DOCUMENTS

KR 1020070043444 4/2007

* cited by examiner

*Primary Examiner* — Selim Ahmed
(74) *Attorney, Agent, or Firm* — IP & T Group LLP

(57) ABSTRACT

A resistance variable memory device includes: a first electrode; a second electrode; a resistance variable layer interposed between the first electrode and the second electrode; and nano particles that are disposed in the resistance variable layer and have a lower dielectric constant than the resistance variable layer.

14 Claims, 7 Drawing Sheets

RESISTANCE VARIABLE MEMORY DEVICE INCLUDING NANO PARTICLES AND METHOD FOR FABRICATING THE SAME

CROSS-REFERENCE TO RELATED APPLICATIONS

The present application claims priority of Korean Patent Application No. 10-2011-0146243, filed on Dec. 29, 2011, which is incorporated herein by reference in its entirety.

BACKGROUND

1. Field

Exemplary embodiments of the present invention relate to a resistance variable memory device and a fabrication method thereof, and more particularly, to a resistance variable memory device using nano particles and a method for fabricating the resistance variable memory device.

2. Description of the Related Art

A resistance variable memory device stores data by using a resistance variable material that may switch between two or more different resistance states because the resistance variable material has its resistance that varies according to an external stimulus. Examples of the resistance variable material include a perovskite-based material and a transition metal oxide. FIG. 1 is a cross-sectional view illustrating a basic structure of a conventional resistance variable memory device and the features of the conventional technology.

Referring to FIG. 1, the resistance variable memory device has a structure where a resistance variable layer 20 is interposed between a lower electrode 10 and an upper electrode 30. Filament-type current paths 40 are formed or disappear in the resistance variable layer 20 according to a voltage applied between the lower electrode 10 and the upper electrode 30. When the current paths 40 are formed, the resistance variable layer 20 has a low resistance. When the current paths 40 disappear, the resistance variable layer 20 has a high resistance. A set operation is when the resistance variable layer switches from a high resistance state to a low resistance state, and conversely, a reset operation is when the resistance variable layer switches from a low resistance state to a high resistance state.

According to the conventional technology, vacancies, which are a sort of defect, are non-uniformly distributed in the resistance variable layer 20, and the current paths 40 are formed randomly in the resistance variable layer 20. In other words, although the same voltage is applied between the lower electrode 10 and the upper electrode 30, the positions and the number of the current paths 40 may be different. The non-uniform distribution of the current paths 40 makes set voltage/current and reset voltage/current non-uniform as well, which deteriorates the uniformity of switching.

Also, set or reset current depends on the voltage applied between the lower electrode 10 and the upper electrode 30.

However, since the current paths 40 are dispersed into several parts, the current paths 40 may be difficult to control. Particularly, since excessive initial reset current deteriorates device characteristics as switching is performed repeatedly, the reliability of a resistance variable memory device may further deteriorate.

Meanwhile, a method of forming nano dots of a conductive material such as metal in a resistance variable layer that is formed of a transition metal oxide is suggested to address the above features. However, when the resistance variable layer includes conductive nano dots, the voltage applied to the whole memory cell may be difficult to control, and vacancies to be formed in the resistance variable layer may be difficult to form uniformly.

SUMMARY

An embodiment of the present invention is directed to a resistance variable memory device with improved switching characteristics by controlling current paths that are formed in a resistance variable layer, and a method for fabricating the resistance variable memory device.

In accordance with an embodiment of the present invention, a resistance variable memory device includes: a first electrode; a second electrode; a resistance variable layer interposed between the first electrode and the second electrode; and nano particles that are disposed in the resistance variable layer and have a lower dielectric constant than the resistance variable layer.

In accordance with another embodiment of the present invention, a method for fabricating a resistance variable memory device includes: forming a first electrode over a substrate; forming a first resistance variable layer over the first electrode; forming nano particles over the first resistance variable layer; forming a second resistance variable layer over the first resistance variable layer including the nano particles; and forming a second electrode over the second resistance variable layer, wherein the nano particles are formed of a material having a lower dielectric constant than materials of the first and second resistance variable layers.

In accordance with yet another embodiment of the present invention, a method for fabricating a resistance variable memory device includes: forming a first electrode over a substrate; forming nano particles over the first electrode; forming a resistance variable layer over the first electrode including the nano particles; and forming a second electrode over the resistance variable layer, wherein the nano particles are formed of a material having a lower dielectric constant than materials of the resistance variable layers.

DETAILED DESCRIPTION

Figure 1:
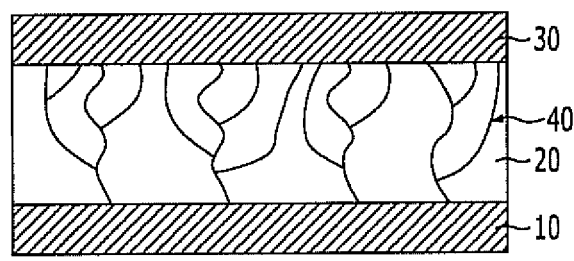
FIG. 1 is a cross-sectional view illustrating a basic structure of a conventional resistance variable memory device and the problem of the conventional technology.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIGS. 2A to 2G are cross-sectional views illustrating a resistance variable memory device and a fabrication method thereof in accordance with a first embodiment of the present invention.

Figure 2A:
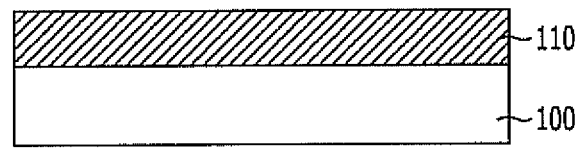
FIGS. 2A to 2G are cross-sectional views illustrating a resistance variable memory device and a fabrication method thereof in accordance with a first embodiment of the present invention.

Referring to FIG. 2A, a first electrode 110 is formed over a substrate 100 having an understructure (not shown). The first electrode 110 may include a conductive material. For example, the first electrode 110 may include at least one selected from the group consisting of metals such as platinum (Pt), gold (Au), silver (Ag), tungsten (W), aluminum (Al), ruthenium (Ru), iridium (Ir), titanium (Ti), hafnium (Hf), zirconium (Zr), cobalt (Co), nickel (Ni), chrome (Cr) and copper (Cu), metal nitrides such as titanium nitride (TiN), tantalum nitride (TaN), tungsten nitride (WN), titanium aluminum nitride (TiAlN), titanium silicon nitride (TiSiN), and metal oxides such as ruthenium oxide ($RuO_x$), iridium oxide ($IrO_x$), and indium tin oxide (ITO).

Figure 2B:
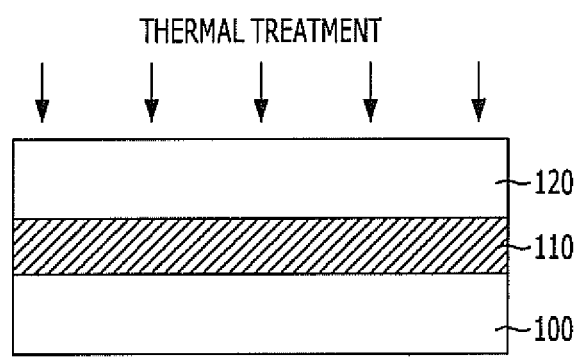

Referring to FIG. 2B, a first resistance variable layer 120 is formed over the first electrode 110. The first resistance variable layer 120 includes a resistance variable material. For example, the first resistance variable layer 120 may include at least one selected from the group consisting of a binary oxide material including a transition metal oxide (TMO) such as titanium dioxide ($TiO_2$), hafnium dioxide ($HfO_2$), zirconium oxide ($ZrO_2$), aluminum oxide ($Al_2O_3$), tantalum oxide ($Ta_2O_5$), niobium oxide ($Nb_2O_5$), lanthanum oxide ($La_2O_3$), nickel oxide (NiO), copper oxide (CuO), cobalt oxide ($Co_3O_4$), and tungsten oxide ($WO_3$), a perovskite-based material such as STO ($SrTiO_3$), BTO ($BaTiO_3$) and PCMO ($Pr_{1-x}Ca_xMnO_3$), and a chalcogenide-based material such as GST (GeSbTe) where germanium, antimony, and tellurium are combined in a designated ratio.

Subsequently, the substrate 100 including the first resistance variable layer 120 undergoes a thermal treatment. The thermal treatment may be a Rapid Thermal Annealing (RTA), and/or Rapid Thermal Processing (RTP), or Furnace thermal treatment. The thermal treatment may be performed in an atmosphere of an oxidation gas, a reduction gas, or in a vacuum condition. As a result of the thermal treatment, a plurality of vacancies may be formed in the first resistance variable layer 120.

Figure 2C:
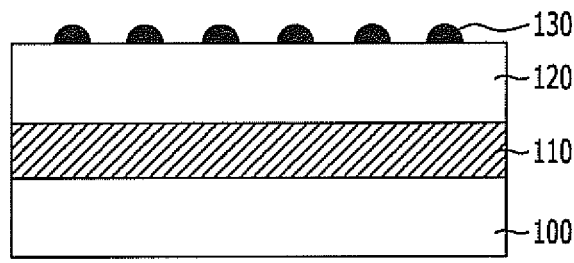

Referring to FIG. 2C, island-type nano particles 130 are formed over the first resistance variable layer 120. The nano particles 130 are formed of a material having a lower dielectric constant (relative permittivity) than the first resistance variable layer 120 and a second resistance variable layer, which is to be described later. For example, when the first resistance variable layer 120 and the second resistance variable layer, which is to be described later, are formed of crystalline titanium dioxide ($TiO_2$), the nano particles 130 are formed of amorphous aluminum oxide ($Al_2O_3$) or silicon dioxide ($SiO_2$). As a result, when a voltage is applied between the first electrode 110 and a second electrode, which is to be described later, an electric field may be concentrated on the nano particles 130. Therefore, filament-type current paths are not divided into several parts but are concentrated on the nano particles 130, and thus the current paths may be controlled.

Particularly, in the resistance variable memory device having a plurality of memory cells, uniform switching characteristics may be obtained by forming the nano particles 130, which are uniformly distributed on an interface between the first resistance variable layer 120 that constitutes each memory cell and a second resistance variable layer, which is to be described layer. More specifically, the resistance variable memory device may be more reliable by uniformly maintaining the set voltage/current and reset voltage/current of each memory cell. Also, since a voltage drop primarily occurs in the nano particles 130, the reset current may be decreased. In this way, deterioration of device characteristics that occurs as switching is performed repeatedly may be prevented. In addition, although six nano particles 130 are illustrated in the cross-sectional view, the present embodiment is not limited to six nano particles 130, and any number more than one nano particles 130 may be uniformly distributed by inputting a precursor of the same amount for each memory cell during a deposition process.

The nano particles 130 may be formed through a method such as Plasma Enhanced Atomic Layer Deposition (PE-ALD), thermal Atomic Layer Deposition (ALD), Plasma Enhanced Chemical Vapor Deposition (PE-CVD), metal organic Chemical Vapor Deposition (CVD), rapid thermal CVD, atmospheric pressure CVD, low pressure CVD, very low pressure CVD, and ultra-high vacuum CVD. During the deposition process, nano particles 130 of several angstroms (Å) to several nanometers (nm) may be formed according to an intrinsic growth mechanism such as Volmer-Weber or Stranski-Krastanov by changing the procedural conditions, such as temperature, according to a type of precursor.

Figure 2D:
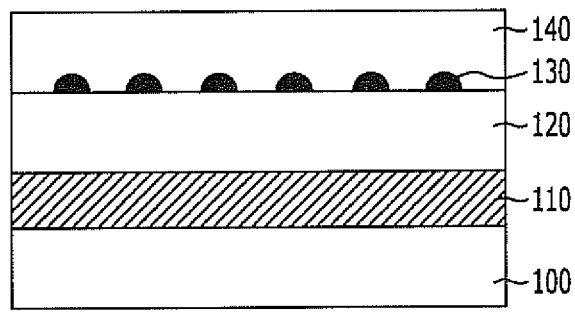

Referring to FIG. 2D, a second resistance variable layer 140 is formed over the first resistance variable layer 120 including the nano particles 130. The second resistance variable layer 140 may include a resistance variable material. The resistance variable material includes at least one selected from the group consisting of a binary oxide material including a transition metal oxide (TMO) such as titanium dioxide ($TiO_2$), hafnium dioxide ($HfO_2$), zirconium oxide ($ZrO_2$), aluminum oxide ($Al_2O_3$), tantalum oxide ($Ta_2O_5$), niobium oxide ($Nb_2O_5$), lanthanum oxide ($La_2O_3$), nickel oxide (NiO), copper oxide (CuO), cobalt oxide ($Co_3O_4$), and tungsten oxide ($WO_3$), a perovskite-based material such as STO ($SrTiO_3$), BTO ($BaTiO_3$) and PCMO ($Pr_{1-x}Ca_xMnO_3$), and a chalcogenide-based material such as GST (GeSbTe) where germanium, antimony, and tellurium are combined in a designated ratio.

Figure 2E:
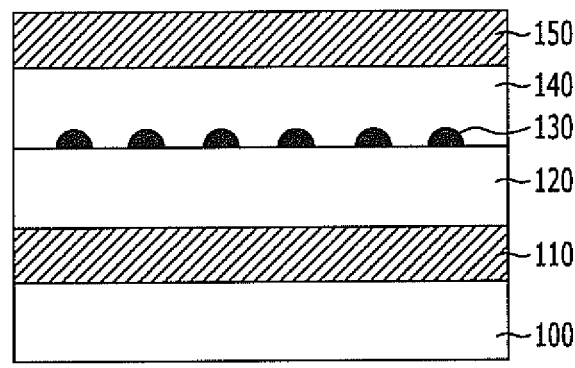

Referring to FIG. 2E, a second electrode 150 is formed over the second resistance variable layer 140. The second electrode 150 may include a conductive material. The conductive material includes at least one selected from the group consisting of metals such as platinum (Pt), gold (Au), silver (Ag), tungsten (W), aluminum (Al), ruthenium (Ru), iridium (Ir), titanium (Ti), hafnium (Hf), zirconium (Zr), cobalt (Co), nickel (Ni), chrome (Cr) and copper (Cu), metal nitrides such as titanium nitride (TiN), tantalum nitride (TaN), tungsten nitride (WN), titanium aluminum nitride (TiAlN), titanium silicon nitride (TiSiN), and metal oxides such as ruthenium oxide ($RuO_x$), iridium oxide ($IrO_x$), and indium tin oxide (ITO).

Figure 2F:
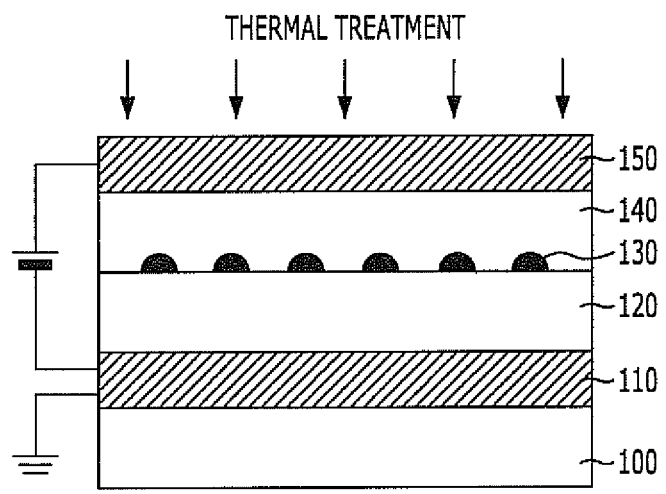

Referring to FIG. 2F, a thermal treatment is performed on the substrate 100 including the second electrode 150 while an electric field is applied between the first electrode 110 and the second electrode 150. The thermal treatment may be a Rapid Thermal Annealing (RTA), and/or Rapid Thermal Processing (RTP), or Furnace thermal treatment. The thermal treatment may be performed in an atmosphere of gas that includes at least one selected from the group consisting of ammonia ($NH_3$), nitrogen ($N_2$), hydrogen ($H_2$), oxygen ($O_2$) and ozone ($O_3$), or the thermal treatment may be performed in a vacuum condition. Particularly, a transfer of ions in the first resistance variable layer 120 and the second resistance variable layer 140 may be promoted by applying an electric field between the first electrode 110 and the second electrode 150 during the thermal treatment. As a result, a forming process for initially forming filament-type current paths, which are to be described later, may be omitted.

FIGS. 3A to 3E are cross-sectional views illustrating a resistance variable memory device and a fabrication method thereof in accordance with a second embodiment of the present invention. In the description of the second embodiment of the present invention, detailed description that is substantially the same as that of the first embodiment of the present invention is omitted. The processes of FIGS. 3A to 3D of the second embodiment are performed after performing the process of FIG. 2A of the first embodiment.

Figure 3A:
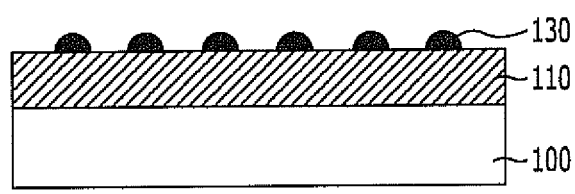
FIGS. 3A to 3E are cross-sectional views illustrating a resistance variable memory device and a fabrication method thereof in accordance with a second embodiment of the present invention.

Referring to FIG. 3A, island-type nano particles 130 are formed over the first electrode 110. The nano particles 130 are formed of a material having a lower dielectric constant (relative permittivity) than a resistance variable layer 200, which is to be described later. As a result, when a voltage is applied between the first electrode 110 and a second electrode 150, which is to be described later, an electric field may be concentrated on the nano particles 130.

Particularly, switching characteristics may be improved by forming the nano particles 130 that are to be uniformly distributed over the first electrode 110. Also, since a voltage drop primarily occurs in the nano particles 130, reset current may be decreased. As a result, deterioration of device characteristics that occurs as switching is performed repeatedly may be prevented.

The nano particles 130 may be formed through a method such as Plasma Enhanced Atomic Layer Deposition (PE-ALD), thermal Atomic Layer Deposition (ALD), Plasma Enhanced Chemical Vapor Deposition (PE-CVD), metal organic Chemical Vapor Deposition (CVD), rapid thermal CVD, atmospheric pressure CVD, low pressure CVD, very low pressure CVD, and ultra-high vacuum CVD.

Figure 3B:
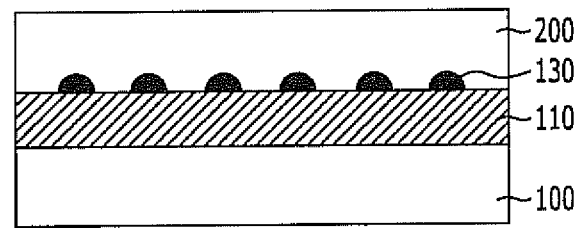

Referring to FIG. 3B, a resistance variable layer 200 is formed over the first electrode 110 including the nano particles 130. The resistance variable layer 200 may include a resistance variable material. The resistance variable material includes at least one selected from the group consisting of a binary oxide material including a transition metal oxide (TMO) such as titanium dioxide ($TiO_2$), hafnium dioxide ($HfO_2$), zirconium oxide ($ZrO_2$), aluminum oxide ($Al_2O_3$), tantalum oxide ($Ta_2O_5$), niobium oxide ($Nb_2O_5$), lanthanum oxide ($La_2O_3$), nickel oxide (NiO), copper oxide (CuO), cobalt oxide ($Co_3O_4$), and tungsten oxide ($WO_3$), a perovskite-based material such as STO ($SrTiO_3$), BTO ($BaTiO_3$) and PCMO ($Pr_{1-x}Ca_xMnO_3$), and a chalcogenide-based material such as GST (GeSbTe) where germanium, antimony, and tellurium are combined in a designated ratio.

Figure 3C:
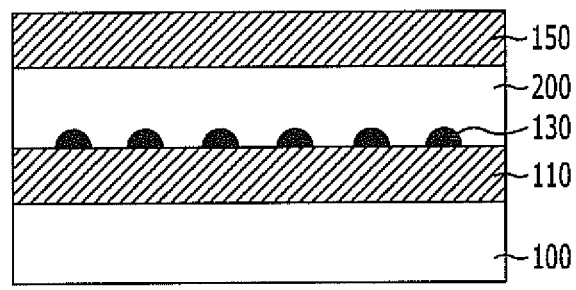

Referring to FIG. 3C, a second electrode 150 is formed over the resistance variable layer 200. The second electrode 150 may include a conductive material. The conductive material includes at least one selected from the group consisting of metals such as platinum (Pt), gold (Au), silver (Ag), tungsten (W), aluminum (Al), ruthenium (Ru), iridium (Ir), titanium (Ti), hafnium (Hf), zirconium (Zr), cobalt (Co), nickel (Ni), chrome (Cr) and copper (Cu), metal nitrides such as titanium nitride (TiN), tantalum nitride (TaN), tungsten nitride (WN), titanium aluminum nitride (TlAlN), titanium silicon nitride (TiSiN), and metal oxides such as ruthenium oxide ($RuO_x$), iridium oxide ($IrO_x$), and indium tin oxide (ITO).

Figure 3D:
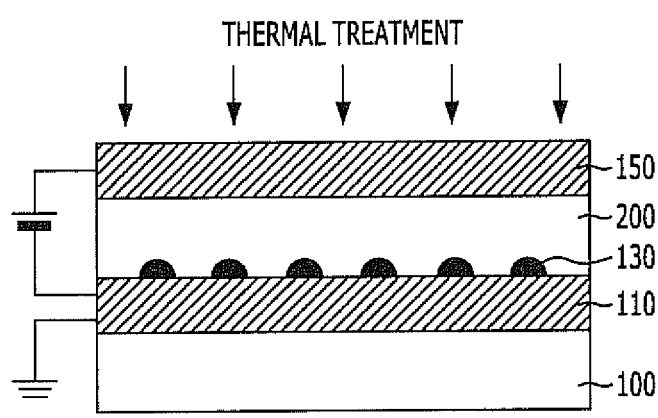

Referring to FIG. 3D, a thermal treatment is performed on the substrate 100 including the second electrode 150 while an electric field is applied between the first electrode 110 and the second electrode 150. The thermal treatment may be a Rapid Thermal Annealing (RTA), and/or Rapid Thermal Processing (RTP), or Furnace thermal treatment. The thermal treatment may be performed in an atmosphere of gas that includes at least one selected from the group consisting of ammonia ($NH_3$), nitrogen ($N_2$), hydrogen ($H_2$), oxygen ($O_2$) and ozone ($O_3$), or the thermal treatment may be performed in a vacuum condition.

The second embodiment of the present invention is different from the first embodiment in that the nano particles 130 are disposed at an interface between the first electrode 110 and the resistance variable layer 200.

Figure 2G:
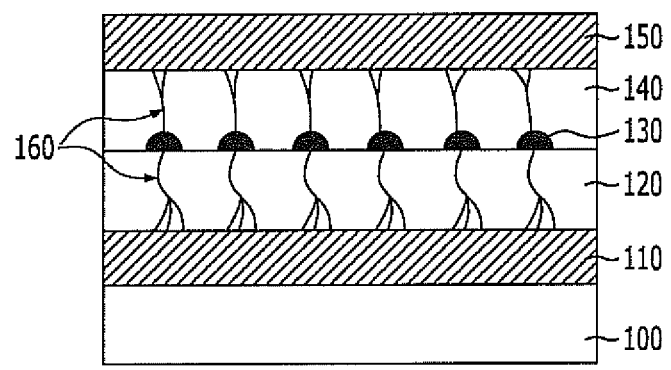
Figure 3E:
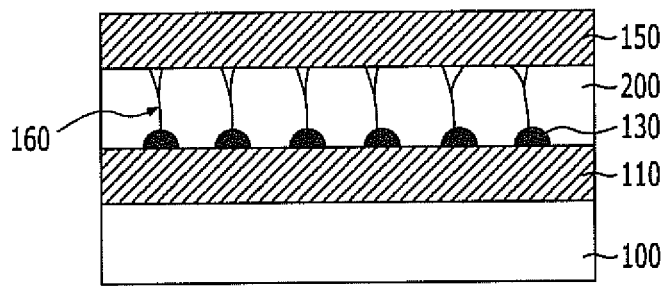

Through the fabrication method described above, the resistance variable memory devices in accordance with the first and second embodiments of the present invention illustrated in FIGS. 2G and 3E may be fabricated.

Referring to FIGS. 2G and 3E, the resistance variable memory devices in accordance with the first and second embodiments of the present invention may include a resistance variable layer that is interposed between the first electrode 110 and the second electrode 150. The resistance variable memory devices in accordance with the first and second embodiments of the present invention may further include the nano particles 130 disposed in the resistance variable layer.

Herein, the resistance variable layer may include the first resistance variable layer 120 and the second resistance variable layer 140 disposed over the first resistance variable layer 120. The resistance variable layer may include at least one selected from the group consisting of a binary oxide material including a transition metal oxide, a perovskite-based material, and a chalcogenide-based material. The nano particles 130 may be formed to have a size of several angstroms (Å) to several nanometers (nm) and are disposed on the interface between the first resistance variable layer 120 and the second resistance variable layer 140 or on the interface between the first electrode 110 and the resistance variable layer 200.

Particularly, the nano particles 130 are formed of a material having a lower dielectric constant than the resistance variable layer. As a result, when a voltage is applied between the first electrode 110 and the second electrode 150, an electric field is concentrated on the nano particles 130. As a result, filament-type current paths 160, which are formed of vacancies, are concentrated on the nano particles 130. Because the filament-type current paths 160 are concentrated on the nano particles 130, the current paths 160 may be controlled. Furthermore, since the nano particles 130 are uniformly distributed in each memory cell and the set voltage/current and reset voltage/current are maintained at a uniform level, switching characteristics may be uniform as well. In addition, since a voltage drop occurs primarily in the nano particles 130, reset current is decreased. Thus, deterioration in device characteristics that occurs as switching is performed repeatedly may be prevented.

According to an embodiment of the present invention, a resistance variable memory device may have improved switching characteristics by forming nano particles that have a lower dielectric constant than the resistance variable layer and are uniformly distributed in the resistance variable layer. The resistance variable memory device may also have improved switching characteristics by controlling current paths.

While the present invention has been described with respect to the specific embodiments, it will be apparent to those skilled in the art that various changes and modifications may be made without departing from the spirit and scope of the invention as defined in the following claims.

What is claimed is:

1. A resistance variable memory device, comprising:
   a first electrode;
   a second electrode;
   a resistance variable layer interposed between the first electrode and the second electrode; and
   nano particles that are disposed in the resistance variable layer and have a lower dielectric constant than the resistance variable layer,
   wherein the resistance variable layer includes crystalline oxide and the nano particles include amorphous oxide.

2. The resistance variable memory device of claim 1, wherein the nano particles are uniformly distributed in the resistance variable layer.

3. The resistance variable memory device of claim 1, wherein the resistance variable layer includes a first resistance variable layer and a second resistance variable layer disposed over the first resistance variable layer, and
   the nano particles are disposed at an interface between the first resistance variable layer and the second resistance variable layer.

4. The resistance variable memory device of claim 1 wherein the nano particles are disposed at an interface between the first electrode and the resistance variable layer.

5. The resistance variable memory device of claim 1, wherein the nano particles have a size of several angstroms (Å) to several nanometers (nm).

6. The resistance variable memory device of claim 1, wherein the resistance variable layer includes at least one selected from the group consisting of a binary oxide material including a transition metal oxide (TMO), a perovskite-based material, and a chalcogenide-based material.

7. The resistance variable memory device of claim 1, wherein the amorphous oxide includes aluminum oxide or silicon dioxide.

8. A method for fabricating a resistance variable memory device, comprising:
   forming a first electrode over a substrate;
   forming a first resistance variable layer over the first electrode;
   forming nano particles over the first resistance variable layer;
   forming a second resistance variable layer over the first resistance variable layer including the nano particles; and
   forming a second electrode over the second resistance variable layer,
   wherein the nano particles are formed of a material having a lower dielectric constant than materials of the first and second resistance variable layers, and
   wherein the first resistance variable layer and the second resistance variable layer include crystalline oxide, and the nano particles include amorphous oxide.

9. The method of claim 8, further comprising:
   performing a thermal treatment on the substrate including the first resistance variable layer after the forming of the first resistance variable layer.

10. The method of claim 8, wherein each of the first resistance variable layer and the second resistance variable layer includes at least one selected from the group consisting of a binary oxide material including a transition metal oxide (TMO), a perovskite-based material, and a chalcogenide-based material.

11. The method of claim 8, wherein the nano particles are uniformly distributed over the first resistance variable layer.

12. The method of claim 8, wherein the nano particles have a size of several angstroms (Å) to several nanometers (nm).

13. The method of claim 8, further comprising:
   performing a thermal treatment on the substrate including the second electrode while an electric field is applied between the first electrode and the second electrode after the forming of the second electrode.

14. The method of claim 8, wherein the amorphous oxide includes aluminum oxide or silicon dioxide.

* * * * *